(12) United States Patent
Nishizuka (10) Patent No.: US 11,879,278 B2
(45) Date of Patent: Jan. 23, 2024

(54) VEHICLE DOOR CONTROL DEVICE

(71) Applicant: ALPHA CORPORATION, Kanagawa (JP)

(72) Inventor: Mitsuo Nishizuka, Yokohama (JP)

(73) Assignee: ALPHA CORPORATION, Kanagawa (JP)

( * ) Notice: Subject to any disclaimer, the term of this patent is extended or adjusted under 35 U.S.C. 154(b) by 758 days.

(21) Appl. No.: 17/019,797

(22) Filed: Sep. 14, 2020

(65) Prior Publication Data
US 2020/0408008 A1 Dec. 31, 2020

Related U.S. Application Data

(63) Continuation of application No. PCT/JP2019/018786, filed on May 10, 2019.

(30) Foreign Application Priority Data

May 11, 2018 (JP) ................................ 2018-092002

(51) Int. Cl.
*E05B 81/76* (2014.01)
*B60Q 3/217* (2017.01)
*B60J 5/04* (2006.01)
(Continued)

(52) U.S. Cl.
CPC ............ *E05B 81/77* (2013.01); *B60J 5/0413* (2013.01); *B60J 5/0468* (2013.01); *B60Q 3/217* (2017.02); *B60R 25/01* (2013.01); *B60R 25/20* (2013.01); *E05B 81/56* (2013.01); *E05B 85/12* (2013.01); *E05Y 2400/86* (2013.01); *E05Y 2900/531* (2013.01); *G06F 3/0488* (2013.01)

(58) Field of Classification Search
CPC ........ E05B 81/77; E05B 81/56; B60J 5/0468; B60Q 3/217; B60R 25/01; B60R 25/20;
(Continued)

(56) References Cited

U.S. PATENT DOCUMENTS

| 2011/0181387 A1 | 7/2011 | Popelard |
| 2012/0314438 A1* | 12/2012 | Gutt ...................... B60Q 3/267 362/545 |

(Continued)

FOREIGN PATENT DOCUMENTS

| DE | 10 2015 014 615 A1 | 5/2016 |
| JP | S64-006480 A | 1/1989 |

(Continued)

OTHER PUBLICATIONS

International Search Report issued in PCT/JP2019/018786; dated Jun. 4, 2019.
(Continued)

*Primary Examiner* — Isaac G Smith
(74) *Attorney, Agent, or Firm* — Studebaker & Brackett PC (57) ABSTRACT

A vehicle door control device includes a swipe operation portion provided on a vehicle interior side of a door, a detection unit provided at least in the swipe operation portion and configured to detect a swipe operation, a door lock device configured to hold the door in a closed state, and a controller configured to release a closed state of the door by the door lock device when it is determined that the swipe operation is detected based on a detection result of the detection unit.

5 Claims, 8 Drawing Sheets

(51) Int. Cl.
    *B60R 25/01*     (2013.01)
    *B60R 25/20*     (2013.01)
    *E05B 81/56*     (2014.01)
    *E05B 85/12*     (2014.01)
    *G06F 3/0488*     (2022.01)

(58) Field of Classification Search
    CPC ........... E05Y 2400/86; E05Y 2900/531; G06F 3/0488
    USPC .......................................................... 701/49
    See application file for complete search history.

(56) References Cited

U.S. PATENT DOCUMENTS

| | | | |
|---|---|---|---|
| 2015/0077227 A1* | 3/2015 | Salter | ..................... E05C 19/02 340/5.72 |
| 2018/0038146 A1 | 2/2018 | Linden et al. | |

FOREIGN PATENT DOCUMENTS

| | | |
|---|---|---|
| JP | 2003-206675 A | 7/2003 |
| JP | 2017-172140 A | 9/2017 |
| JP | 2018-053667 A | 4/2018 |

OTHER PUBLICATIONS

The extended European search report issued by the European Patent Office dated Dec. 21, 2021, which corresponds to European Patent Application No. 19799146.6-1005 and is related to U.S. Appl. No. 17/019,797.

* cited by examiner

VEHICLE DOOR CONTROL DEVICE

CROSS REFERENCE TO RELATED APPLICATIONS

This application is a continuation of PCT application No. PCT/JP2019/018786, which was filed on May 10, 2019 based on Japanese Patent Application No. 2018-092002 filed on May 11, 2018, the contents of which are incorporated herein by reference.

BACKGROUND OF THE INVENTION

Field of the Invention

The present invention relates to a vehicle door control device.

Description of Related Art

A door lock device described in Patent Literature 1 includes a latch member that holds a door closed, a ball member that locks the latch member, a lock release instruction unit that detects a contact with a door grip and generates a door opening instruction signal, and a lock release unit that releases the lock of the latch member by the ball member in response to the door opening instruction signal. According to the door lock device, when a user grasps the door grip, the contact with the door grip is detected and the door opening instruction signal is generated. Accordingly, the lock of the latch member is released, and the door can be opened by driving the door in an opening direction. Therefore, since the opening of the door responds to an operation of a person for opening the door, such as grasping the door grip, conscious operation is not necessary.

[Patent Literature 1] JP-A-S64-6480

According to a related art, a single sensor electrode is disposed on the door grip to detect the contact with the door grip from a change in electrostatic capacity. Therefore, even if the user touches the door grip without an intention to open the door, the lock of the latch member is released.

SUMMARY

One or more embodiments provide a vehicle door control device appropriately reflecting an operation intention of the user in a vehicle door control device.

According to one or more embodiments, a vehicle door control device includes a swipe operation portion provided on a vehicle interior side of a door, a detection unit provided at least in the swipe operation portion and configured to detect a swipe operation, a door lock device configured to hold the door in a closed state, and a controller configured to release a closed state of the door by the door lock device when it is determined that the swipe operation is detected based on a detection result of the detection unit.

DETAILED DESCRIPTION

Figure 1:
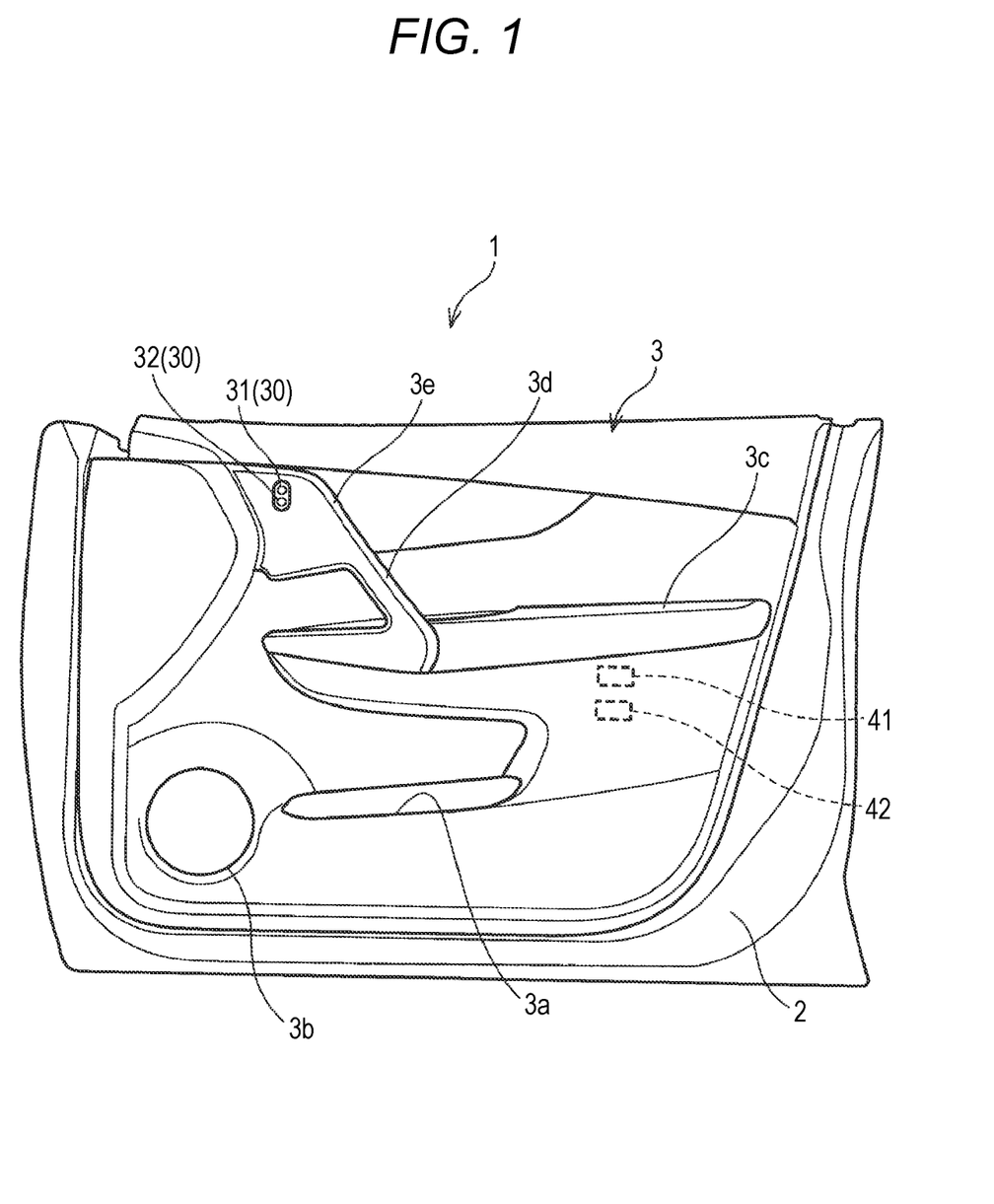
FIG. 1 is a front view illustrating a side door to which a vehicle door control device is applied.
Figure 2:
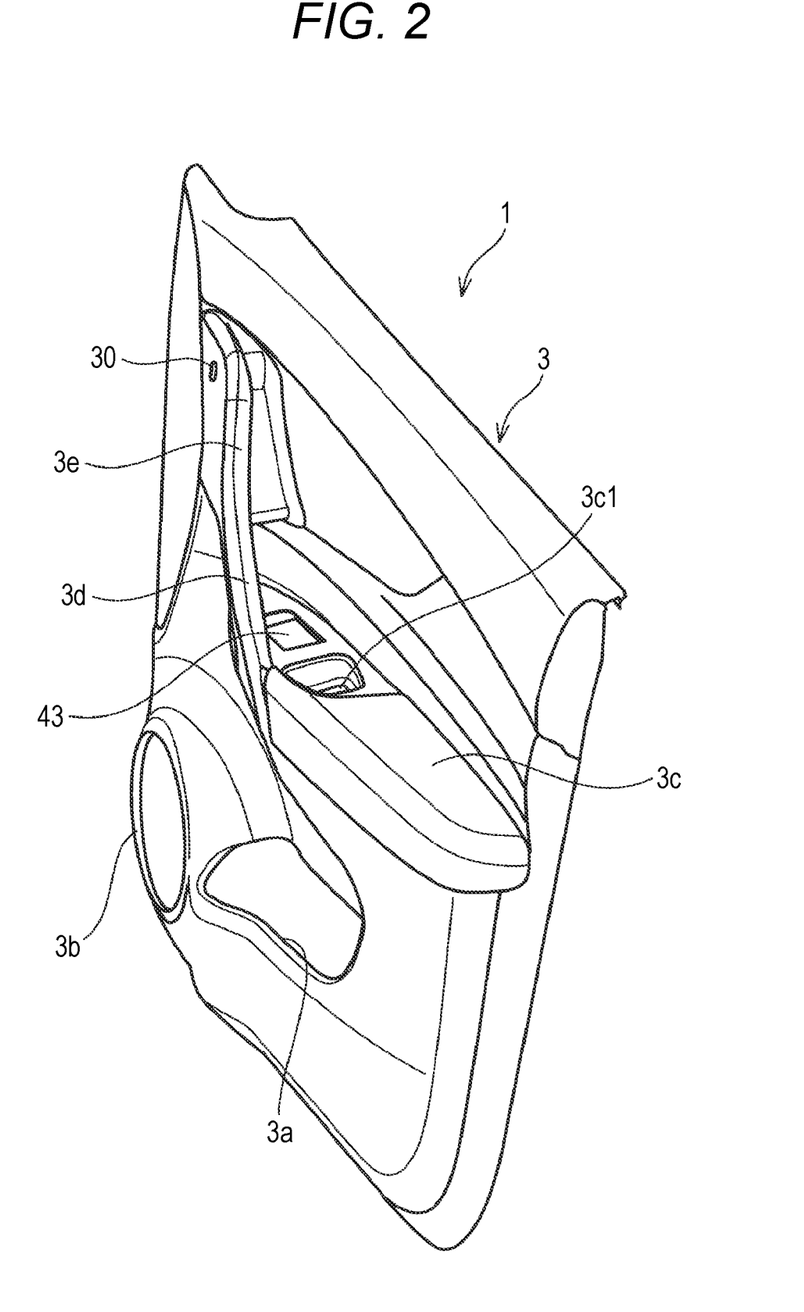
FIG. 2 is a perspective view illustrating the side door.
Figure 3:
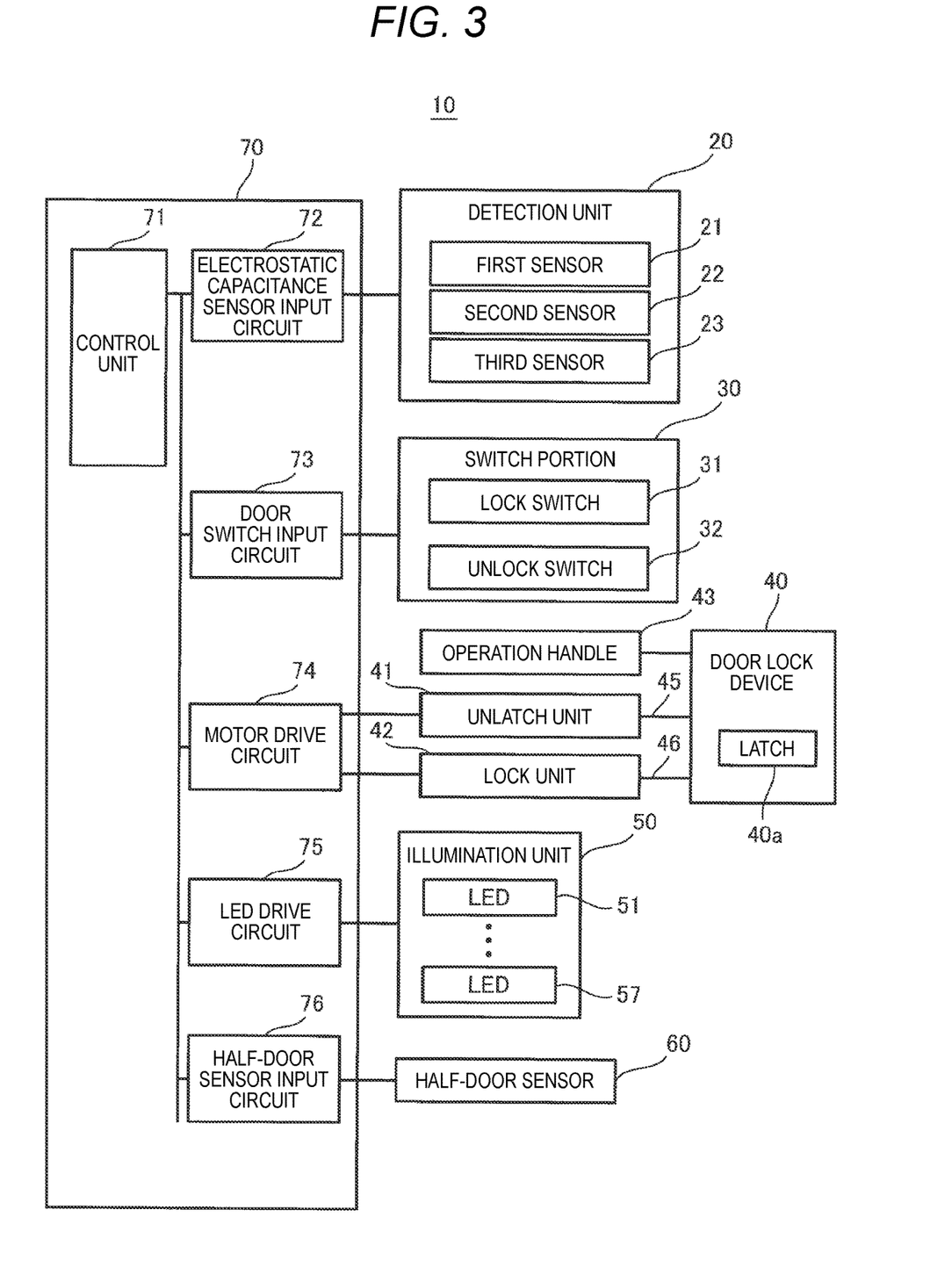
FIG. 3 is a block diagram illustrating a configuration of the vehicle door control device.
Figure 4:
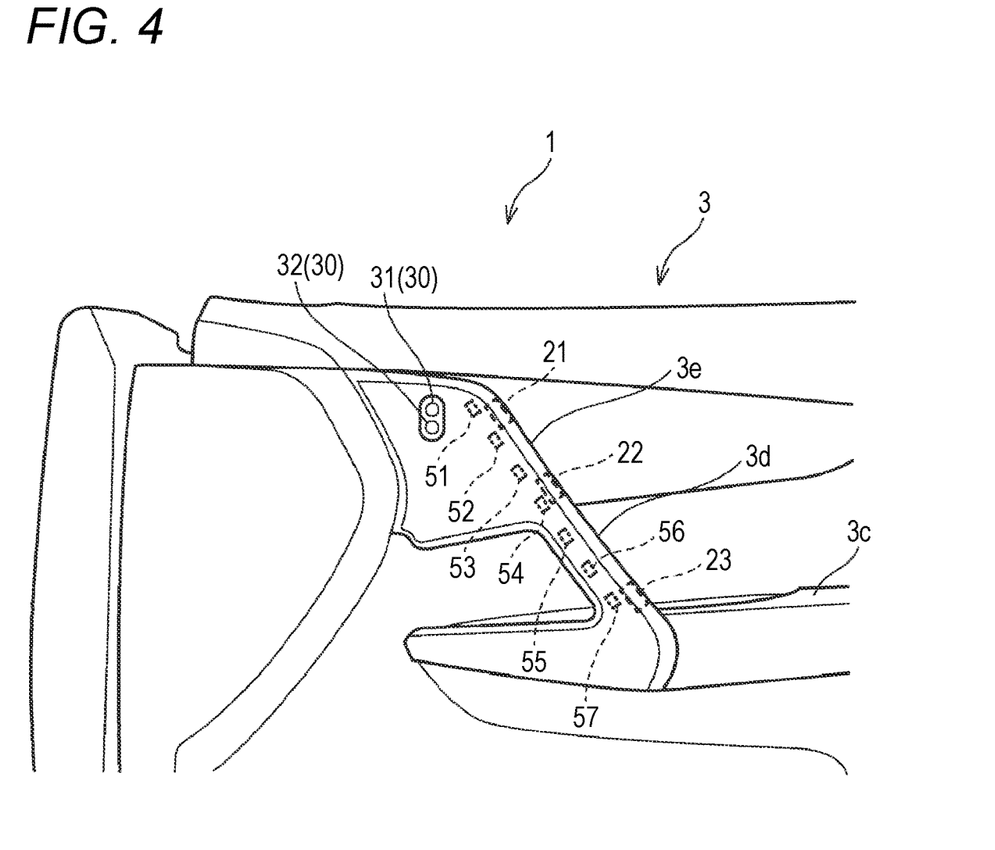
FIG. 4 is an enlarged front view of a main part of the side door.

Hereinafter, a vehicle door control device 10 according to the present embodiment will be described as being applied to a side door 1 of a vehicle. Here, FIG. 1 is a front view illustrating the side door 1 to which the vehicle door control device 10 according to the present embodiment is applied. FIG. 2 is a perspective view illustrating the side door 1. FIG. 3 is a block diagram illustrating a configuration of the vehicle door control device 10. FIG. 4 is an enlarged front view of a main part of the side door 1.

The side door 1 is a front-side side door that opens and closes a door opening between a front pillar and a center pillar. A front end portion of the side door 1 is connected to a vehicle body via a hinge mechanism (not shown) and is rotatable around the hinge mechanism. The side door 1 mainly includes a door body 2 and a door trim 3.

The door body 2 includes a door outer panel that forms a door half body on a vehicle exterior side and a door inner panel that forms a door half body on a vehicle interior side. The door outer panel and the door inner panel form a closed cross-section by joining peripheral portions thereof and a space is formed inside the closed cross-section.

The door trim 3 is an interior component that decorates an interior of the vehicle, and is provided on the vehicle interior side of the door body 2 so as to cover the door body 2. The main part of the door trim 3 has a surface shape along a vehicle upper-lower direction and a vehicle front-rear direction. In the door trim 3, a door pocket 3a is provided at a lower position of the door trim 3 in the vehicle upper-lower direction, and a speaker grill 3b is provided in front of the door pocket 3a. A door armrest 3c is provided at a central position of the door trim 3 in the vehicle upper-lower direction.

a door assist grip (handle portion) 3d that serves as a handle when the side door 1 is opened and closed is provided in front of the door armrest 3c. The door assist grip 3d is disposed in an oblique shape of facing downward from a front side to a rear side of the vehicle. A swipe operation portion 3e continuously shaped so as to be continuous with the door assist grip 3d is provided on an upper end of the door assist grip 3d.

The swipe operation portion 3e is disposed in a vertical wall shape so as to face the door trim 3, and forms a gap with the door trim 3. A user can perform a swipe operation using the swipe operation portion 3e by moving a hand from an upper side to a lower side along the shaping of the swipe operation portion 3e in a state in which a finger is inserted in the gap. Further, since the swipe operation portion 3e is shaped so as to be continuous with the door assist grip 3d, the hand can be moved to the door assist grip 3d with a series of movement from the swipe operation. In the present embodiment, the swipe operation of moving the hand to the door assist grip 3d along the swipe operation portion 3e is adopted as an operation for opening the side door 1.

The vehicle door control device 10 mainly includes a detection unit 20, a switch unit 30, a door lock device 40, an illumination unit 50, a half-door sensor 60, and a control device 70.

The detection unit 20 detects the swipe operation of moving the hand (a human body) in contact with and along the swipe operation portion 3e (including movement in a state of approaching), and includes a plurality of electrostatic capacitance sensors, which are three electrostatic capacitance sensors 21 to 23 in the present embodiment. Each of the electrostatic capacitance sensors 21 to 23 detects contact (including approach) of the user based on a change in electrostatic capacitance. As illustrated in FIG. 4, the first electrostatic capacitance sensor 21 (hereinafter, referred to as "first sensor 21" as necessary) is disposed on an upper end side of the swipe operation portion 3e, the second electrostatic capacitance sensor 22 (hereinafter, referred to as "second sensor 22" as necessary) is disposed on a lower end side of the swipe operation portion 3e, the third electrostatic capacitance sensor 23 (hereinafter, referred to as "third sensor 23") is disposed on a lower end side of the door assist grip 3d. It is possible to detect a swipe operation reaching the door assist grip 3d along the swipe operation portion 3e according to detection results from the first sensor 21 to the third sensor 23, that is, by sequentially detecting the contact of the user from the first sensor 21 to the third sensor 23. Therefore, based on the direction of the swipe operation, the first sensor 21 is disposed at a most upstream position, the second sensor 22 is disposed downstream of the first sensor 21, and the third sensor 23 is disposed further downstream (most downstream).

The switch unit 30 includes a lock switch 31 and an unlock switch 32. The lock switch 31 and the unlock switch 32 are disposed on a part of a shaping surface of the door trim 3. The lock switch 31 is a switch for operating the door lock device 40 into a locked state. The unlock switch 32 is a switch for operating the door lock device 40 into an unlocked state.

The door lock device 40 is a device that holds the side door 1 in a closed state, and includes a latch 40a that engages with the vehicle body. An unlatch unit 41, a lock unit 42, and an operation handle 43 are connected to the door lock device 40 via a cable device.

Figure 5:
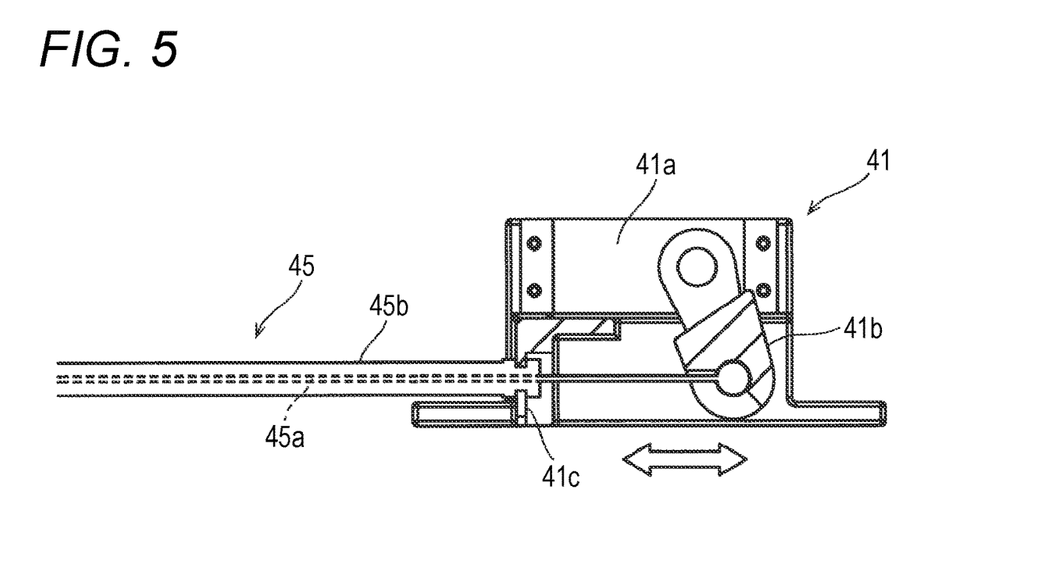
FIG. 5 is an illustrative diagram illustrating a configuration of an unlatch unit.

FIG. 5 is an illustrative diagram illustrating a configuration of the unlatch unit 41. The unlatch unit 41 is a device that is controlled by the control device 70 to release the closed state of the side door 1 by the door lock device 40. The unlatch unit 41 includes an unlatch motor 41a and an unlatch lever 41b connected to an output shaft of the unlatch motor 41a. A first cable device 45 connecting the unlatch lever 41b and the door lock device 40 to each other is connected to the unlatch lever 41b.

The first cable device 45 includes an inner cable 45a and a tubular outer cable 45b. The inner cable 45a is inserted into a hollow of the outer cable 45b and can move inside the outer cable 45b. One end portion of the outer cable 45b is fixed to a cable holding portion 41c of the unlatch unit 41, and the other end portion thereof is fixed to the door lock device 40. One end portion of the inner cable 45a is connected to the unlatch lever 41b, and the other end portion thereof is connected to a movable point that operates the latch 40a of the door lock device 40.

When the unlatch unit 41 is not in operation, the unlatch lever 41b is in an initial position (not shown). In the state in which the unlatch lever 41b is in the initial position, the inner cable 45a is not pulled, and a movable point of the door lock device 40 is not operated. In this case, the latch 40a of the door lock device 40 is in an engagement state (latched state) of being engaged with the vehicle body. Therefore, the side door 1 is held in the closed state.

Then, when the unlatch unit 41 is in operation, the unlatch motor 41a rotates by a predetermined amount in a forward direction. When the unlatch lever 41b rotates from the initial position to an unlatched position by the rotation of the unlatch motor 41a, the inner cable 45a connected to the unlatch lever 41b is pulled (a state illustrated in FIG. 5). Thus, the movable point of the door lock device 40 connected to the other end of the inner cable 45a is operated. By this operation, the engagement state between the latch 40a and the vehicle body is released (unlatched state). That is, by operating the unlatch unit 41 and inputting an operation force to the door lock device 40, the closed state of the side door 1 by the door lock device 40 is released.

On the other hand, when the unlatch unit 41 stops operating, the unlatch motor 41a rotates in a reverse direction by a predetermined amount. When the unlatch lever 41b rotates from the unlatched position to the initial position by the rotation of the unlatch motor 41a, the inner cable 45a connected to the unlatch lever 41b is returned. Accordingly, the movable point of the door lock device 40 connected to the other end of the inner cable 45a is operated to an initial state. By this operation, the latch 40a comes into in the latched state in which the latch 40a can be engaged with the vehicle body. Therefore, when the side door 1 is in the closed state, the closed state thereof is held.

Figure 6:
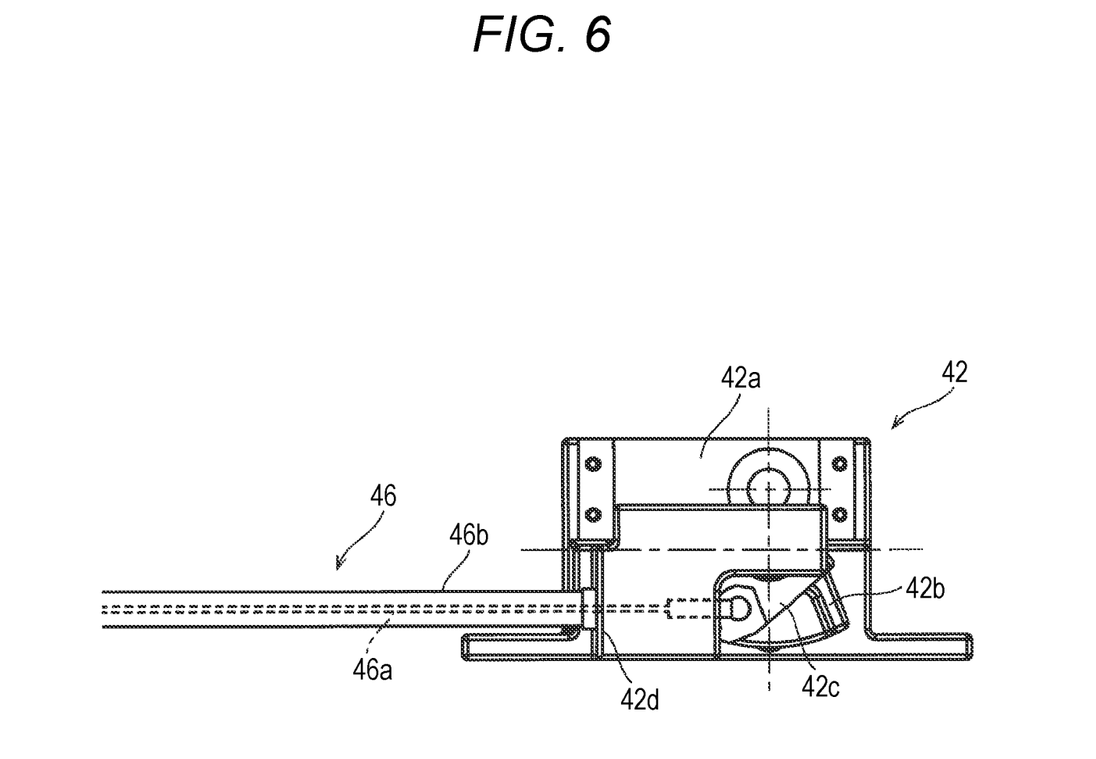
FIG. 6 is an illustrative diagram illustrating a configuration of a lock unit.

FIG. 6 is an illustrative diagram illustrating a configuration of the lock unit 42. FIGS. 7A to 7D are illustrative diagrams illustrating an operation of the lock unit 42. The lock unit 42 is a device that is controlled by the control device 70 to switch between the unlocked state of the door lock device 40 and the locked state of the door lock device 40. The unlocked state of the door lock device 40 is a state in which the input of the operation force to the door lock device 40 by the unlatch unit 41 is valid, and corresponds to a state in which the closed state of the side door 1 can be released. On the other hand, the locked state of the door lock device 40 is a state in which the input of the operation force to the door lock device 40 by the unlatch unit 41 is invalid, and corresponds to a state in which the release of the closed state of the side door 1 is prohibited.

The lock unit 42 includes a lock motor 42a, a motor lever 42b connected to an output shaft of the lock motor 42a, and a lock lever 42c pivotally supported by a rotation shaft different from the motor lever 42b. A tip end of the motor lever 42b is formed as a substantially U-shaped movable piece 42b1, and is configured to rotate the lock lever 42c by engaging with an engagement pin 42c1 disposed on the lock lever 42c.

A second cable device 46 connecting the lock lever 42c and the door lock device 40 to each other is connected to the lock lever 42c. The second cable device 46 includes an inner cable 46a and a tubular outer cable 46b. The inner cable 46a is inserted into a hollow of the outer cable 46b and can move inside the outer cable 46b. One end portion of the outer cable 46b is fixed to the cable holding portion 42d of the lock unit 42, and the other end portion thereof is fixed to the door lock device 40. One end portion of the inner cable 46a is connected to the lock lever 42c, and the other end portion thereof is connected to the door lock device 40.

When the motor lever 42b is in the initial position (FIG. 7A), the lock lever 42c is in a lock position. In this case, the door lock device 40 is in the locked state. In the locked state, since the operation of the door lock device 40 by the unlatch unit 41 is canceled, the opening of the side door 1 is restricted.

Figure 7A:
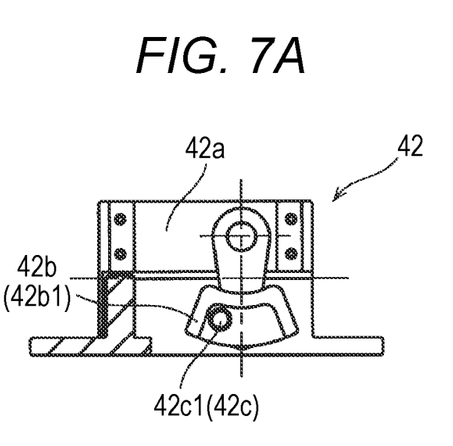
FIGS. 7A to 7D are illustrative diagrams illustrating an operation of the lock unit.
Figure 7B:
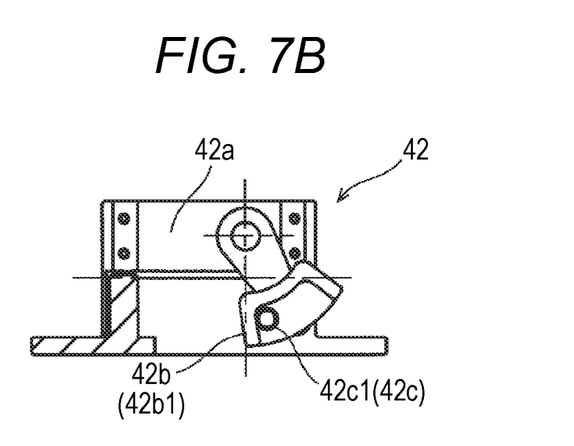

First, a switching operation from the locked state to the unlocked state will be described. When the lock unit 42 is in operation, the lock motor 42*a* is rotated by a predetermined amount in the forward direction. The rotation of the lock motor 42*a* causes the motor lever 42*b* to rotate in a first direction (counterclockwise direction in FIGS. 7A to 7D) to a first rotation position (FIG. 7B). At this time, one end of the movable piece 42*b*1 of the motor lever 42*b* is engaged with the engagement pin 42*c*1 of the lock lever 42*c*, so that the engagement pin 42*c*1 is pushed, and the lock lever 42*c* rotates to an unlock position (FIG. 7B). When the lock lever 42*c* rotates to the unlock position, the inner cable 46*a* connected to the lock lever 42*c* is pulled. When the inner cable 46*a* is pulled, the door lock device 40 connected to the other end of the inner cable 46*a* is operated, and the door lock device 40 comes into the unlocked state. In the unlocked state, since the operation of the door lock device 40 by the unlatch unit 41 is valid, the side door 1 can be opened.

Figure 7C:
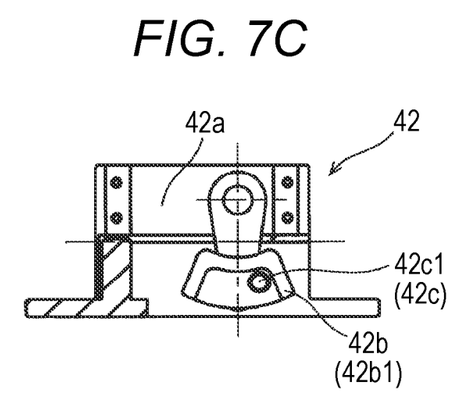

Then, the lock motor 42*a* is rotated by a constant amount in the reverse direction. The rotation of the lock motor 42*a* causes the motor lever 42*b* to rotate in a second direction (clockwise direction in FIGS. 7A to 7D) to an initial position. Since the movable piece 42*b*1 of the motor lever 42*b* rotates without being engaged with the engagement pin 42*c*1 of the lock lever 42*c*, only the motor lever 42*b* returns to the initial position (FIG. 7C). Therefore, the lock lever 42*c* maintains the unlock position.

Figure 7D:
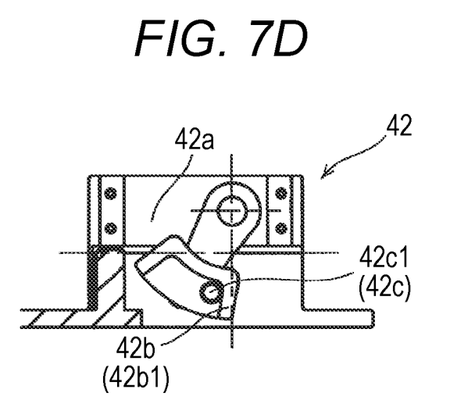

Next, a switching operation from the unlocked state to the locked state will be described. When the lock unit 42 is in operation, the lock motor 42*a* is rotated by a predetermined amount in the reverse direction. The rotation of the lock motor 42*a* causes the motor lever 42*b* to rotate in the second direction (clockwise direction in FIGS. 7A to 7D) to a second rotation position (FIG. 7D). At this time, the other end of the movable piece 42*b*1 of the motor lever 42*b* is engaged with the engagement pin 42*c*1 of the lock lever 42*c*, so that the engagement pin 42*c*1 is pushed, and the lock lever 42*c* rotates to the lock position (FIG. 7D). When the lock lever 42*c* rotates to the lock position, the inner cable 46*a* connected to the lock lever 42*c* is pushed. When the inner cable 46*a* is pushed, the door lock device 40 connected to the other end of the inner cable 46*a* is operated, and the door lock device 40 comes into the locked state. In the locked state, since the operation of the door lock device 40 by the unlatch unit 41 is canceled, the opening of the side door 1 is restricted.

Then, the lock motor 42*a* is rotated by a constant amount in the forward direction. The rotation of the lock motor 42*a* causes the motor lever 42*b* to rotate in a second direction (counterclockwise direction in FIGS. 7A to 7D) to the initial position. Since the movable piece 42*b*1 of the motor lever 42*b* rotates without being engaged with the engagement pin 42*c*1 of the lock lever 42*c*, only the motor lever 42*b* returns to the initial position (FIG. 7A). Therefore, the lock lever 42*c* maintains the lock position.

The operation handle 43 releases the closed state of the side door 1 by operating the door lock device 40 by a manual operation of the user. As described above, the release of the closed state of the side door 1 is performed by operating the door lock device 40 by the unlatch unit 41. However, the operation handle 43 for manual operation is provided assuming a failure and the like of the unlatch unit 41. The operation handle 43 is provided in the vicinity of the door assist grip 3*d* on an upper surface of the door arm rest 3*c*. When viewed from the vehicle interior side, since the operation handle 43 is covered by the door assist grip 3*d*, the operation handle 43 can be disposed in an inconspicuous state.

A rear end of the operation handle 43 is pivotally supported by a pin (not shown), and a front end side is configured to be rotatable around the rear end thereof. The operation handle 43 rotates within a range between a closed position that is flush with the door arm rest 3*c* and an open position where a front end side thereof is pulled up from the door arm rest 3*c*. The operation handle 43 is connected to the door lock device 40 via a third cable device including an inner cable and an outer cable.

When the operation handle 43 is rotated from the closed position to the open position, the third cable device connected to the operation handle 43 is pulled. Accordingly, the movable point of the door lock device 40 connected to the other end of the third cable device is operated. By this operation, the engagement state between the latch 40*a* and the vehicle body is released (unlatched state). That is, by pulling up the operation handle 43 and inputting an operation force to the door lock device 40, the closed state of the side door 1 by the door lock device 40 is released.

The illumination unit 50 is provided to guide the direction of the swipe operation by illumination. The illumination unit 50 includes a plurality of LEDs which are seven LEDs 51 to 57 in the present embodiment. As described above, the swipe operation corresponds to an operation of continuously tracing the swipe operation portion 3*e* from the upper side to the lower side toward the door assist grip 3*d*. As illustrated in FIG. 4, the seven LEDs 51 to 57 are arranged at a predetermined pitch from an upper end of the swipe operation portion 3*e* to a lower end of the door assist grip 3*d*. Specifically, three LEDs 51 to 53 are arranged from the upper end to the lower end of the swipe operation portion 3*e*, and four LEDs 54 to 57 are arranged from the upper end to the lower end of the door assist grip 3*d*. By sequentially turning on the LEDs 51 to 57 from the upper end of the swipe operation portion 3*e* to the lower end of the door assist grip 3*d*, the direction of the swipe operation can be guided.

The half-door sensor 60 is a sensor that detects a half door of the side door 1. Specifically, the half-door sensor 60 detects whether an opening angle of the side door 1 is equal to or larger than a threshold for detecting the half door.

The control device 70 is a device that controls the vehicle door control device 10. The control device 70 mainly includes a controller 71, a electrostatic capacitance sensor input circuit 72, a door switch input circuit 73, a motor drive circuit 74, an LED drive circuit 75, and a half-door sensor input circuit 76.

The control unit 71 outputs a control signal to each of the drive circuits 74, 75 based on information input from each of the input circuits 72, 73, and 76. Through the control signal, an operating state of the unlatch unit 41, an operating state of the lock unit 42, and lighting states of the LEDs 51 to 57 constituting the illumination unit 50 are controlled. A microcomputer mainly including a CPU, a ROM, a RAM, and an I/O interface can be used as the control unit 71. The CPU performs various types of control in accordance with a control program (processor). The ROM stores a program executed by the CPU, or data necessary for executing the program. The RAM is a work area when the CPU executes the program.

In relation to the present embodiment, the control unit 71 releases the closed state of the side door 1 by the door lock device 40 when the contact of the user is determined to be a swipe operation of moving to the door assist grip 3*d* along the swipe operation portion 3*e* based on the detection results from the first sensor 21 to the third sensor 23.

The sensor signals of the first sensor 21, the second sensor 22, and the third sensor 23 are input to the electrostatic capacitance sensor input circuit 72. The sensor signals input to the electrostatic capacitance sensor input circuit 72 are output to the control unit 71.

A switch signal of the lock switch 31 and the unlock switch 32 is input to the door switch input circuit 73. The switch signal input to the door switch input circuit 73 is output to the control unit 71.

The motor drive circuit 74 rotationally drives the unlatch motor 41*a* of the unlatch unit 41 and the lock motor 42*a* of the lock unit 42 in response to the control signal from the control unit 71.

The LED driving circuit 75 turns on and drives the seven LEDs 51 to 57 in response to the control signal from the control unit 71.

A sensor signal from the half-door sensor 60 is input to the half-door sensor input circuit 76. The sensor signal input to the half-door sensor input circuit 76 is output to the control unit 71.

Figure 8:
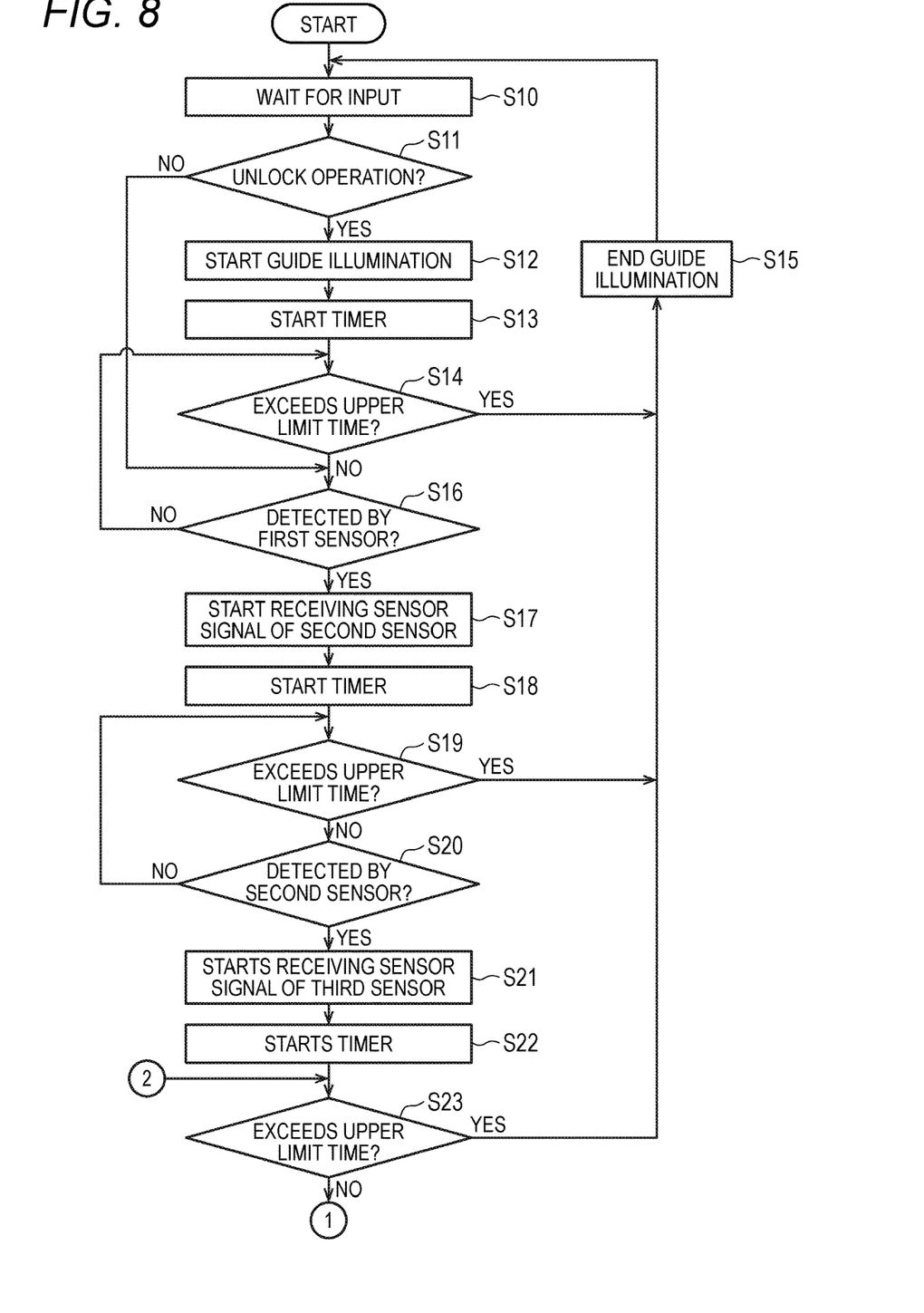
FIG. 8 is a flowchart illustrating an operation of the vehicle door control device according to the present embodiment.
Figure 9:
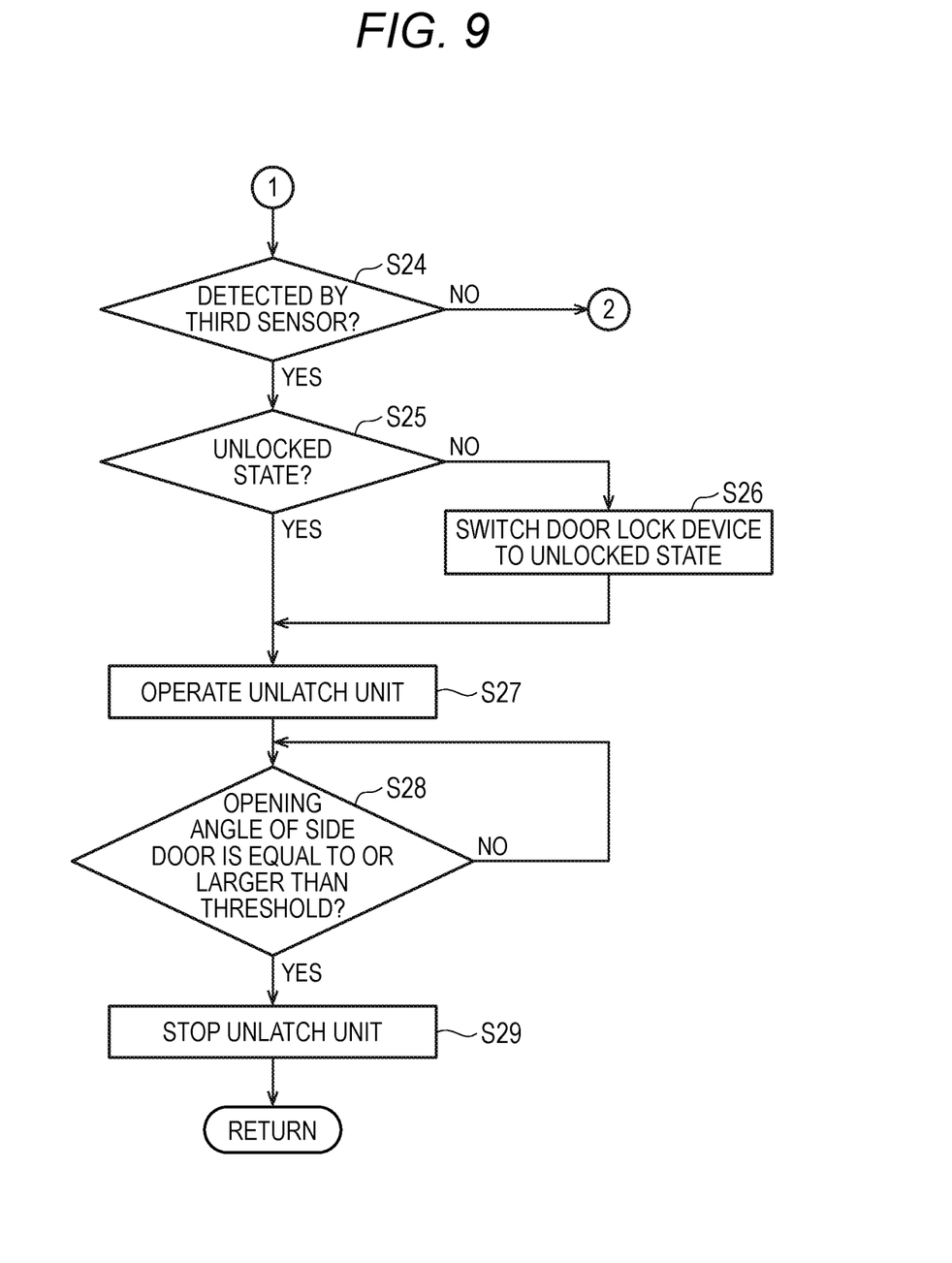
FIG. 9 is a flowchart illustrating the operation of the vehicle door control device.

An operation of the vehicle door control device 10 according to the present embodiment will be described. Here, FIGS. 8 and 9 are flowcharts illustrating the operation of the vehicle door control device 10 according to the present embodiment. Processing illustrated in the flowchart is executed by the control device 70. At the start of this flowchart, it is possible to receive the sensor input (sensor signal) of only the first sensor (electrostatic capacitance sensor at the most upstream position along the direction of the swipe operation) 21 in the three electrostatic capacitance sensors 21 to 23 of the detection unit 20.

First, in step S10, the control device 70 waits for an input of the sensor signal of the first sensor 21 and the switch signal of the unlock switch 32. If the signal is input, the waiting processing is terminated, and the processing proceeds to step S11.

In step S11, the control device 70 determines whether an unlock operation for operating the unlock switch 32 is performed. The presence or absence of the unlock operation is determined by the presence or absence of the input of the switch signal of the unlock switch 32. When the unlock operation is performed, an affirmative determination is made in step S11, and the processing proceeds to step S12. On the other hand, when the unlock operation is not performed, a negative determination is made in step S11, and the processing proceeds to step S16.

In step S12, the control device 70 starts guide illumination by turning on and driving the LEDs 51 to 57 of the illumination unit 50. The guide illumination guides the direction of the swipe operation by sequentially turning on the LEDs 51 to 57 from the upper end of the swipe operation portion 3*e* toward the lower end of the door assist grip 3*d*. Each of the lighted LEDs 51 to 57 is turned off after a certain period of time based on the lighting timing thereof, and is turned on again after a certain period of time, and this operation is repeated until the guide illumination ends.

In step S13, the control device 70 starts a timer.

In step S14, the control device 70 determines whether a count value of the timer exceeds an upper limit time. The upper limit time in step S14 indicates a valid time from the operation of the unlock switch 32 to when a contact operation is performed at the upper end (an arrangement position of the first sensor 21) of the swipe operation portion 3*e*, and an optimum value is set through an experiment or simulation. When the count value of the timer exceeds the upper limit time, an affirmative determination is made in step S14, and the processing proceeds to step S15. On the other hand, when the count value of the timer does not exceed the upper limit time, a negative determination is made in step S14, and the processing proceeds to step S16.

In step S15, the control device 70 ends the guide illumination.

In step S16, the control device 70 determines whether the contact is detected by the first sensor 21 located at the upper end of the swipe operation portion 3*e*. When the contact is detected by the first sensor 21, an affirmative determination is made in step S16, and the processing proceeds to step S17. When the contact is not detected by the first sensor 21, a negative determination is made in step S16, and the processing proceeds to step S14.

In step S17, the control device 70 starts receiving the sensor signal of the second sensor 22.

In step S18, the control device 70 resets a count value of the timer and then restarts the timer.

In step S19, the control device 70 determines whether the count value of the timer exceeds the upper limit time. The upper limit time in step S19 indicates a valid time of the swipe operation from the upper end of the swipe operation portion 3*e* (the arrangement position of the first sensor 21) to the lower end of swipe operation portion 3*e* (the arrangement position of the second sensor 22), and an optimum value is set through an experiment or simulation. When the count value of the timer exceeds the upper limit time, an affirmative determination is made in step S19, and the processing proceeds to step S15. On the other hand, when the count value of the timer does not exceed the upper limit time, a negative determination is made in step S19, and the processing proceeds to step S20.

In step S20, the control device 70 determines whether the contact is detected by the second sensor 22 located at the lower end of the swipe operation portion 3*e*. When the contact is detected by the second sensor 22, an affirmative determination is made in step S20, and the processing proceeds to step S21. When the contact is not detected by the second sensor 22, a negative determination is made in step S20, and the processing proceeds to step S19.

In step S21, the control device 70 starts receiving the sensor signal of the third sensor 23.

In step S22, the control device 70 resets a count value of the timer and then restarts the timer.

In step S23, the control device 70 determines whether the count value of the timer exceeds the upper limit time. The upper limit time in step S23 indicates a valid time of the swipe operation from the lower end of the swipe operation portion 3*e* (the arrangement position of the second sensor 22) to the lower end of the door assist grip 3*d* (the arrangement position of the third sensor 23), and an optimum value is set through an experiment or simulation. When the count value of the timer exceeds the upper limit time, an affirmative determination is made in step S23, and the processing proceeds to step S15. On the other hand, when the count value of the timer does not exceed the upper limit time, a negative determination is made in step S23, and the processing proceeds to step S24.

In step S24, the control device 70 determines whether the contact is detected by the third sensor 23 located at the lower end of the door assist grip 3*d*. When the contact is detected by the third sensor 23, an affirmative determination is made in step S24, and the processing proceeds to step S25. When the contact is not detected by the third sensor 23, a negative determination is made in step S24, and the processing proceeds to step S23.

In step S25, the control device 70 determines whether the door lock device 40 is in the unlocked state. When the door lock device 40 is in the unlocked state, an affirmative determination is made in step S25, and the processing proceeds to step S27. On the other hand, when the door lock device 40 is in the locked state, a negative determination is made in step S25, and the processing proceeds to step S26.

In step S26, the control device 70 operates the lock unit 42 to switch the door lock device 40 to the unlocked state.

In step S27, the control device 70 operates the unlatch unit 41 to switch the door lock device 40 to the unlatched state. That is, the closed state of the side door 1 by the door lock device 40 is released.

In step S28, the control device 70 refers to the sensor signal from the half-door sensor 60 and determines whether the opening angle of the side door 1 is equal to or larger than the threshold for detecting the half door. When the opening angle of the side door 1 is equal to or larger than the threshold, an affirmative determination is made in step S28, and the processing proceeds to step S29. When the opening angle of the side door 1 is less than the threshold, a negative determination is made in step S28, and the processing proceeds to step S28.

In step S29, the control device 70 stops the operation of the unlatch unit 41.

As described above, the vehicle door control device 10 according to the present embodiment includes the swipe operation portion 3e provided on the vehicle interior side of the side door 1, the detection unit 20 provided at least in the swipe operation portion 3e and detecting the swipe operation for moving the hand (human body) along the swipe operation portion 3e, a door lock device 40 holding the side door 1 in the closed state, and the control device 70 releasing the closed state of the side door 1 by the door lock device 40 when the swipe operation is detected based on the detection result of the detection unit 20.

According to this configuration, by performing the swipe operation on the swipe operation portion 3e, the closed state by the door lock device 40 is released, and the side door 1 can be opened. In the swipe operation, it is necessary to trace a certain range by the hand, and thus a clear operation intention of the user is required. Therefore, even in a case where the swipe operation portion 3e or the door assist grip 3d is simply touched, the side door 1 maintains the closed state. Accordingly, since the control is executed by the swipe operation that is an intentional operation of the user, the operation intention of the user can be appropriately reflected.

Further, in the present embodiment, the vehicle door control device 10 further includes the door assist grip 3d that is provided on the vehicle interior side of the side door 1 and serves as a handle when the door is opened or closed. In this case, the swipe operation portion 3e is shaped so as to be continuous with the door assist grip 3d. Then, the control device 70 releases the closed state of the door by the door lock device 40 when it is determined that the operation is the swipe operation of moving to the door assist grip 3d along the swipe operation portion 3e.

According to this configuration, the hand moves from the swipe operation portion 3e to the door assist grip 3d by the swipe operation. Accordingly, the hand naturally moves to the door assist grip 3d that serves as a handle when the side door 1 is opened along with the release operation (swipe operation) of the closed state by the door lock device 40. Accordingly, the release operation of the closed state by the door lock device 40 and the opening operation of the side door 1 can be continuously performed by a simple movement using only one hand.

Further, in the present embodiment, the vehicle door control device 10 further includes the illumination unit 50 that is provided in the swipe operation portion 3e and the door assist grip 3d and guides the direction of the swipe operation by illumination.

According to this configuration, since the swipe operation may be performed along the illumination of the illumination unit 50, the operation of the user can be guided. Accordingly, a device that is easy to understand for the user can be provided.

Although the detection unit 20 is provided in the door assist grip 3d in the present embodiment, the detection unit 20 may be provided at least in the swipe operation portion 3e. In this case, the control device 70 releases the closed state of the door by the door lock device 40 when it is determined that the operation is the swipe operation of moving to the door assist grip 3d along the swipe operation portion 3e. Similarly, the illumination unit 50 may be provided at least in the swipe operation portion 3e.

Further, in the present embodiment, the door lock device 40 is configured to be switchable between the locked state and the unlocked state according to the operation of the user. When the door lock device 40 is operated from the locked state to the unlocked state, the control device 70 controls the illumination unit 50 to guide the direction of the swipe operation by illumination (guide illumination).

According to this configuration, the guide by the illumination unit 50 is executed in accordance with a scene in which the side door 1 is opened. Accordingly, the guide can be appropriately executed in accordance with operation timing of the user.

Further, in the present embodiment, the door lock device 40 includes the latch 40a that holds the door in the closed state by being engaged with the vehicle body. In this case, the control device 70 releases the latch 40a when the swipe operation is detected.

According to this configuration, the closed state of the side door 1 is appropriately released.

Further, in the present embodiment, the control device 70 continues releasing the latch 40a until the opening angle of the side door 1 reaches or exceeds the threshold.

According to this configuration, the latch 40a is continuously released until the latch 40a is completely disengaged from the vehicle body. Accordingly, the user can appropriately perform the opening operation of the side door 1.

Further, the vehicle door control device 10 according to the present embodiment further includes the operation handle 43 that is provided on the vehicle interior side of the side door 1 and can be operated by the user. The operation handle 43 is connected to the door lock device 40 and releases the latch 40a according to an operation of the handle.

According to this configuration, the latch 40a can be released by using the operation handle 43. Accordingly, since it is possible to manually perform the release operation, an operation method in an emergency can be provided.

Further, in the present embodiment, the detection unit 20 is configured by electrostatic capacitance sensors that detects the contact state of the user by the change in the electrostatic capacitance.

According to this configuration, the contact state with the swipe operation portion 3e can be appropriately detected.

Further, in the present embodiment, the control device 70 sequentially switches between a case where the control device 70 can receive the sensor input of only the most upstream electrostatic capacitance sensor 21 along the direction of the swipe operation, and a case where the control device 70 can receive the sensor input of the electrostatic capacitance sensors 22, 23 on the downstream side according to a detection status of the swipe operation of the user.

According to this configuration, it is possible to appropriately determine only the swipe operation starting from the upper end of the swipe operation portion 3e. Accordingly, since similar operations can be eliminated, the highly reliable device can be provided.

In the present embodiment, the detection unit 20 that detects the swipe operation includes the plurality of electrostatic capacitance sensors 21 to 23. However, the detection unit 20 can widely apply the configuration for detecting the swipe operation accompanying the movement of the hand of the user, and a single electrostatic capacitance sensor may be used instead of using the plurality of electrostatic capacitance sensors. It is also possible to use a sensor other than the electrostatic capacitance sensor.

The vehicle door control device according to the embodiment of the present invention has been described above, but the present invention is not limited to the embodiment described above, and various modifications can be made within the scope of the present invention. Further, the device applied to the side door has been described in the above-described embodiment, but the vehicle door control device according to the present embodiment can be applied to various vehicle doors including a back door and the like.

Further, in the present embodiment, the swipe operation portion is shaped so as to be continuous with the door assist grip. However, the present invention is not limited to this form as long as the swipe operation portion is shaped so as to be continuous with the handle portion that opens the side door.

For example, in the case of a vehicle in which the handle portion is set at a vehicle rear position of the door armrest, the swipe operation portion may be shaped at a vehicle front position of the door armrest. At this time, the swipe operation portion may be shaped as a dedicated portion for the door armrest, or may use a part of the shaping of the door armrest.

Further, a recessed pocket portion (a portion indicated by reference numeral "3c1" in FIG. 2) provided on the upper surface of the door armrest may be used as the handle portion, and the swipe operation portion may be combined with this pocket portion. For example, when the door assist grip is shaped so as to be continuous with the pocket portion, the door assist grip can be used as the swipe operation portion. Further, in the case of a door armrest having a structure in which the door assist grip does not exist or a door armrest having a structure in which the door assist grip is separated, the swipe operation portion may be set in front of the pocket portion in the door armrest. At this time, the swipe operation portion may be shaped as a dedicated portion for the door armrest, or may use a part of the shaping of the door armrest.

In addition, it is preferable that the swipe operation portion is disposed on a vehicle front side or a vehicle upper side with respect to the handle portion. Accordingly, the hand moves in a natural manner from the swipe operation on the swipe operation portion to the handle portion. Therefore, it is possible to perform a series of movement such as the release operation of the closed state by the door lock device and the opening operation of the side door with good operability.

In addition, in this embodiment, the swipe operation portion is shaped independently so as to be continuous with the handle portion that opens the side door. However, the swipe operation portion does not have to be entirely dedicated, and may be set so as to cross some or all of the shaping of the handle portion. Further, the swipe operation portion may use the shaping of the handle portion and may be set so as to be superimposed on a part or all of the shaping. Even with such a configuration, the hand moves naturally to the handle portion that opens the side door, or moves to a state of gripping the handle portion along with the release operation of the closed state by the door lock device. Accordingly, the release operation of the closed state by the door lock device and the opening operation of the side door can be continuously performed by a simple movement using only one hand. Thus, in the present invention, the handle portion and the swipe operation portion do not have to be separated from each other in terms of shaping, and may be provided on the vehicle interior side of the door such that respective functions of the handle portion and the swipe operation portion are adjacent to each other or overlap each other.

According to one or more embodiments, the vehicle door control device may further include a handle portion provided on the vehicle interior side of the door and serving as a handle when the door is opened or closed. The swipe operation portion is preferably disposed to be continuous with the handle portion, and the controller is preferably configured to release the closed state of the door by the door lock device when it is determined that a swipe operation moving to the handle portion is detected.

Further, the vehicle door control device may further include a handle portion that is provided on the vehicle interior side of the door and serves as a handle when the door is opened or closed. In this case, the swipe operation portion is preferably set so as to cross a part or all of the shaping of the handle portion, or set so as to overlap a part or all of the shaping of the handle portion.

Further, the vehicle door control device preferably further includes an illumination unit provided at least in the swipe operation portion and configured to guide a direction of the swipe operation by illumination.

Further, the door lock device preferably includes a latch configured to hold the door in the closed state by being engaged with a vehicle body. When it is determined that the swipe operation is detected, the controller is preferably configured to release the latch until an opening angle of the door reaches or exceeds a threshold.

Further, the detection unit is preferably an electrostatic capacitance sensor configured to detect a contact of a user by a change in electrostatic capacitance. A plurality of the electrostatic capacitance sensors are preferably arranged at intervals from an upstream side to a downstream side along the direction of the swipe operation. The controller is preferably configured to start receiving a sensor input to the electrostatic capacitance sensor adjacent to the electrostatic capacitance sensor on the downstream side when the most upstream capacitance sensor detects a sensor input.

According to one or more embodiments, the vehicle door control device capable of appropriately reflecting an operation intention of a user is provided.

What is claimed is:

1. A vehicle door control device comprising:
    a swipe operation portion provided on a vehicle interior side of a door;
    a detection unit provided at least in the swipe operation portion and configured to detect a swipe operation;

a door lock device configured to hold the door in a closed state; and a controller configured to release a closed state of the door by the door lock device when it is determined that the swipe operation is detected based on a detection result of the detection unit;

wherein the detection unit comprises a plurality of sensors each configured to detect a contact of a user;

wherein the plurality of sensors are arranged at intervals from an upstream side to a downstream side along the direction of the swipe operation;

wherein the plurality of sensors includes a first sensor disposed at a most upstream position and a second sensor disposed downstream of the first sensor along the direction of the swipe operation; and wherein the controller is configured to receive a signal from the second sensor only after the controller determines that the first sensor has detected the contact of the user.

2. The vehicle door control device according to claim 1, further comprising:

a handle portion provided on the vehicle interior side of the door and serving as a handle when the door is opened or closed, wherein the swipe operation portion is disposed to be continuous with the handle portion, and wherein the controller is configured to release the closed state of the door by the door lock device when it is determined that a swipe operation moving to the handle portion is detected.

3. The vehicle door control device according to claim 1, further comprising:

a handle portion provided on the vehicle interior side of the door and serving as a handle when the door is opened or closed, wherein a part of the detection unit is disposed on the handle portion.

4. The vehicle door control device according to claim 1, further comprising:

an illumination unit provided at least in the swipe operation portion and configured to guide a direction of the swipe operation by illumination;

wherein the illumination unit includes a plurality of light sources arranged at intervals from a first end of the swipe operation portion to a second end of the swipe operation portion, and the controller is configured to sequentially turn on the light sources from the first end to the second end of the swipe operation portion to guide the direction of the swipe operation.

5. A vehicle door control device comprising:

a swipe operation portion provided on a vehicle interior side of a door;

a detection unit provided at least in the swipe operation portion and configured to detect a swipe operation;

a door lock device configured to hold the door in a closed state;

a controller configured to release a closed state of the door by the door lock device when it is determined that the swipe operation is detected based on a detection result of the detection unit; and a door angle sensor operatively connected to the controller for sensing an opening angle of the door;

wherein the door lock device includes a latch, wherein the latch is engaged with a vehicle body and is configured to hold the door in the closed state, and wherein when it is determined that the swipe operation is detected, the controller is configured to cause the latch to move to an unlatched position and maintain the latch in the unlatched position until the door angle sensor senses the opening angle of the door reaches or exceeds a threshold.

* * * * *